United States Patent [19]

Spohnheimer

[11] 4,406,949
[45] Sep. 27, 1983

[54] METHOD AND APPARATUS FOR ALIGNING AN INTEGRATED CIRCUIT

[75] Inventor: John V. Spohnheimer, The Colony, Tex.

[73] Assignee: Mostek Corporation, Carrollton, Tex.

[21] Appl. No.: 282,858

[22] Filed: Jul. 13, 1981

[51] Int. Cl.$^3$ .............................. G01B 11/00
[52] U.S. Cl. ............................. 250/548; 250/561; 356/400
[58] Field of Search ............ 250/548, 557, 561; 356/400, 401

[56] References Cited

U.S. PATENT DOCUMENTS

| | | | |
|---|---|---|---|
| 3,885,877 | 5/1975 | Horwath et al. | 356/400 |
| 4,213,117 | 7/1980 | Kembo et al. | 250/561 X |
| 4,266,876 | 5/1981 | Nakazawa et al. | 356/400 |
| 4,315,201 | 2/1982 | Suzuki et al. | 250/557 X |

Primary Examiner—David C. Nelms
Assistant Examiner—Edward P. Westin

[57] ABSTRACT

A method and apparatus are disclosed for aligning an integrated circuit die (110) by use of a machine which directs a laser beam (32) downward on a wafer containing the die (110). Each die (110) is provided with one or more targets (52, 64, 78). A target (52) comprises an N+ region (56) within the target (52) and a layer of polysilicon (56) over an oxide layer (70). A laser beam (32) is scanned across the target (52) to detect a transition across an edge of a polysilicon layer (68). The transition is detected by the generation of charge carriers (36) within the region (34). The region (34) has an opposite conductivity type from that of the substrate (10) thus forming a PN junction. The PN junction is reversed biased by a voltage source (38) which is connected in series with a resistor (40) between the substrate (10) and the region (34). A center point is determined by calculating the midpoint between transitions. The establishment of a center of the target (52) establishes a reference point. The establishment of two such reference points determines a scaling factor and an angular orientation factor for the die (110) such that any other point on the die (110) can be accurately located.

4 Claims, 9 Drawing Figures

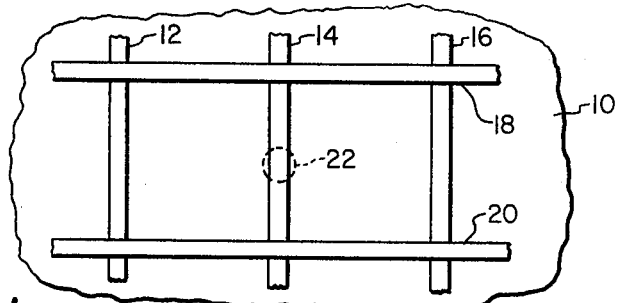
FIG. 1
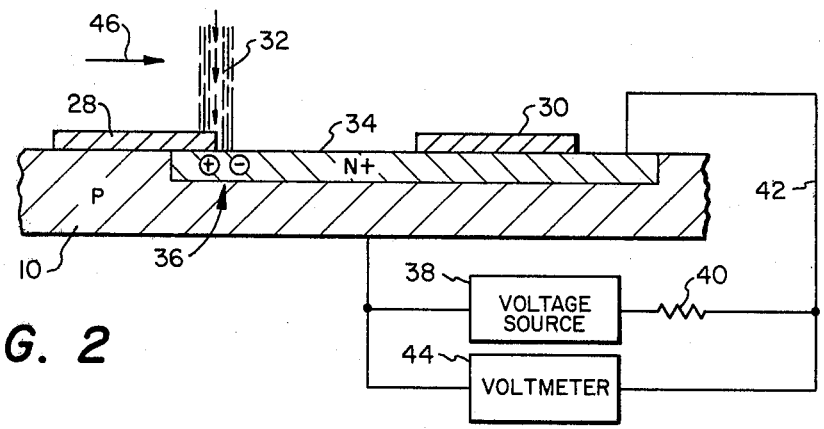
FIG. 2
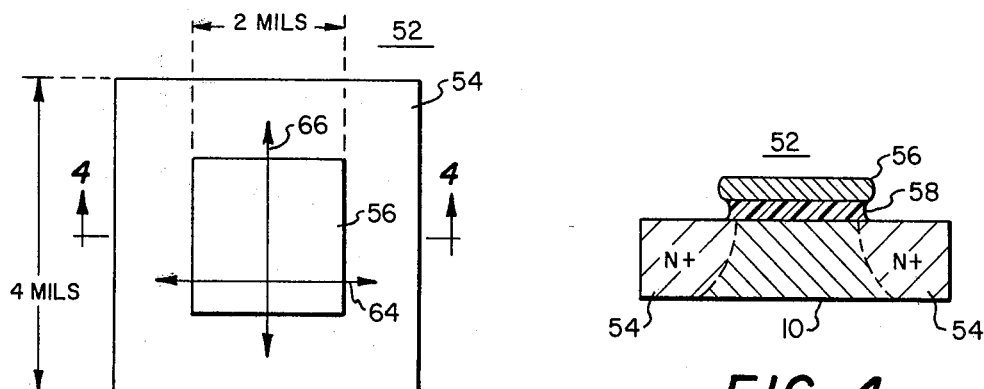
FIG. 3
FIG. 4

METHOD AND APPARATUS FOR ALIGNING AN INTEGRATED CIRCUIT

TECHNICAL FIELD

The present invention pertains to the fabrication of integrated circuits and more particularly to determining the alignment of an integrated circuit die.

BACKGROUND OF THE INVENTION

Integrated circuits are typically manufactured by producing a plurality of similar dies on a single large wafer which may be four to five inches in diameter. As many as several hundred dies may be fabricated on each wafer but to imperfections in processing many of the dies produced on a wafer will be defective. A single die may have thousands of transistors and conducting lines and the failure of any one of these elements can cause the die to be defective. The percentage of good dies for a wafer is referred to as the yield. The cost per die is naturally lower when the yield is made higher.

Certain types of integrated circuits, such as semiconductor memories, have a plurality of similar circuits. It is possible to test a device of this type and determine exactly which one of the plurality of circuits is defective. The device can be manufactured to have a number of extra circuits without seriously increasing the size of the dies. It is then possible to take a defective die and test the die to find the specific defective circuit. By performing operations upon the die the defective circuit can be disconnected and one of the extra circuits interconnected to operate in place of the defective circuit. This procedure makes it possible to "repair" many of the dies which would normally be discarded. If a significant number of the dies can thus be repaired the yield can be increased thereby decreasing the unit cost.

One procedure for removing a defective circuit and replacing it with an extra operable circuit is to burn-out circuit links of the die with the use of a laser beam. However, the laser beam must be precisely alinged and precisely focused in order to blow the desired link without harming nearby conductor lines and circuit elements. As the line dimensions for integrated circuits become smaller it becomes more difficult to properly focus the laser beam to blow the desired links. The procedure for aligning the laser beam must also be extremely fast in order to economically operate on the dies at a mass production rate.

Therefore, there exists a need for a method and apparatus for rapidly and accurately aligning a laser beam on the surface of an integrated circuit.

SUMMARY OF THE INVENTION

In a selected embodiment of the present invention a target structure is fabricated integrally with an integrated circuit die to serve as a reference for a laser beam which is scanned across the die. The target structure includes a region in the substrate of the die wherein the region has a conductivity type opposite from the conductivity of the substrate. The differing conductivities form a PN junction between the substrate and the region. A layer of material is fabricated on the surface of the substrate and has at least one pair of opposed edges which are located over the region in the substrate. The material is at least partially opaque to the laser beam such that charge carriers are generated when the laser beam strikes the region but are not generated when the laser beam strikes the layer of material. Circuitry is provided for detecting the generation of charge carriers by the laser beam. As the laser beam is scanned across the layer of material the edges thereof are detected and accurately located by monitoring the current flow through the PN junction. The mid-point between the transition edges is the center of the layer of material. This center point provides an accurate determination of the location of the integrated circuit.

In a further embodiment of the present invention a plurality of such layers of material forming target structures are detected and the distances between the target structures are calculated. These locations and distances are compared to desired parameters to produce angular and dimensional scaling factors which are utilized to direct the laser beam to any other location on the integrated circuit.

BRIEF DESCRIPTION OF THE DRAWINGS

For a more complete understanding of the present invention and the advantages thereof, reference is now made to the following description taken into conjunction with the accompanying drawings, which are not necessarily drawn to scale, in which:

FIG. 1 is a plan view of a die having metal lines and polysilicon links which are selectively blown to configure the circuit as required;

FIG. 2 is a sectional view of an alignment structure with a laser beam transitioning from an opaque layer to direct inpingement on the substrate to generate charge carriers within the substrate;

FIG. 3 is a plan view of an integrated circuit target structure used for determining alignment on an integrated circuit;

FIG. 4 is a sectional view taken along lines 4—4 of the target structure shown in FIG. 3;

DETAILED DESCRIPTION OF THE INVENTION

Figure 5:
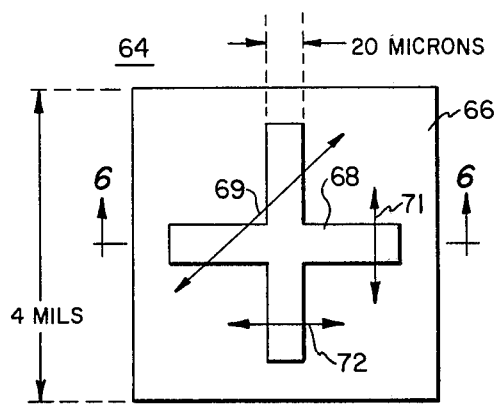
FIG. 5 is a plan view of a second target structure for an integrated circuit.

In the production of complex integrated circuits the yield of parts can be increased by fabricating redundant circuit elements on each die. For the dies which have defective circuit elements, the defective elements can be disconnected and a redundant circuit element can be connected in place of the defective element. The substitution of elements can be accomplished by "blowing" selected links on the die which serve to disconnect certain elements of the circuit and interconnect the redundant elements. The circuit geometries for current integrated circuits are becoming extremely small with line widths of the order of 3-4 microns. Thus the links which must be blown are tightly packing with other circuit elements which must not be damaged when the link is blown. It can therefore be seen that the integrated circuit die must be precisely aligned with the laser beam so that not only is the correct link blown but adjacent conductors and circuit elements are not damaged by the laser beam.

Referring now to FIG. 1 there is illustrated a section of a substrate 10 that is a portion of a larger silicon wafer which has a plurality of dies fabricated thereon. Polysilicon links 12, 14 and 16 are fabricated on the surface of the substrate 10. Metal conductor lines 18 and 20 are also fabricated on the surface of substrate 10 and cross over the polysilicon links 12–16.

A redundant circuit, not shown, on the substrate 10 can be substituted for a defective circuit on the substrate by severing a polysilicon link, such as 14, by directing a laser beam to the region denoted by the reference numeral 22. A laser beam is directed to region 22 and pulsed with sufficient energy to melt link 14. The laser beam must be accurately alinged on the surface of the substrate 10 such that it not only strikes the link 14 but such that it does not strike either of the links 12 and 16 or either of the metal lines 18 and 20. Thus, it can be seen that only a very small margin of error is allowable for aligning the laser beam on the surface of substrate 10.

A structure for detecting the position of a laser beam on the surface of a substrate is illustrated in FIG. 2. Layers 28 and 30 are fabricated on the surface of substrate 10. The material comprising layers 28 and 30 is essentially opaque to a laser beam 32 which is directed downward at the die 10. The substrate 10 comprises silicon which is lightly doped to have a P conductivity characteristic. A region 34 in the substrate 10 is implanted with a N type impurity to create an N+ region. When the laser beam 32 impinges upon the region 34 charge carriers are generated. The charge carriers are represented by the reference numeral 36. Charge carriers are generated only when the laser beam 32 impinges upon the exposed portion of region 34 since little or no energy of the laser beam can penetrate through layers 28 and 30. The combination of the P type substrate 10 and the N+ region 34 produces a PN junction therebetween.

An external circuit is provided to detect the generation of charge carriers which create a current flow across the PN junction. Referring further to FIG. 2 a voltage source 38 has a negative terminal connected to the substrate 10 and a positive terminal connected to a resistor 40. Resistor 40 has an impedance on the order of 1 kilohm. The second terminal of resistor 40 is connected through a line 42 to the N+ region 36. A voltmeter 44 is connected between line 42 and the negative terminal of source 38.

Continuing reference to FIG. 2 the voltage source 38 serves to reverse bias the PN junction between region 34 and the substrate 10. In the absence of any of the carriers 36 there will be essentially no current flow across the PN junction and therefore no current flow through line 42 and resistor 40. With the negative terminal of the voltage source 38 used as a reference the reading of the voltmeter 44 will be essentially the same as the voltage of source 38. But if the laser beam 32 is directed to the surface of region 34 the carriers 36 will be generated to produce a current flow across the PN junction. This current will flow through line 42 and resistor 40 thereby lowering the voltage measured by voltmeter 44. The voltage measured by voltmeter 44 will be at a minimum when the intensity of the laser beam 32 on the region 34 is at a maximum. This procedure is further described in commonly assigned U.S. Patent Application Ser. No. 282,865, filed July 13, 1981 and now U.S. Pat. No. 4,358,659.

As the laser beam 32 is scanned along the substrate 10 in the direction indicated by arrow 46 it will first impinge only upon the layer 28. Under this condition no charge carriers will be generated and the voltmeter 44 will read the maximum voltage which corresponds to the voltage of source 38. But as the laser beam 32 is scanned across the surface of die 10 it will transition across the edge of layer 28 as shown. At the point of transition there will begin the generation of the carriers 36 which will create a current flow through resistor 40 that in turn lowers the voltage measured by voltmeter 44. As the laser beam 32 continues to scan across region 34 it will transition across the inner edge of layer 30. At this point of transition there will be a reduction in the generation of the carriers 36 and the voltage measured by voltmeter 44 will rise. The position of the laser beam 32 is accurately determined by the machine which produces the laser beam. By correlating the position of the beam 32 with the changes in voltage noted by the voltmeter 44, the location of the minimum voltage noted by the voltmeter 44, the location of the edges of layers 28 and 30 can be precisely determined. A machine for producing the laser beam 32 and determining its position accurately is, for example, a model 80 MICROLASE wafer processor manufactured by Electro Scientific Industries, Inc.

Referring now to FIGS. 3 and 4 there is illustrated a target structure 52 which is fabricated as a part of an integrated circuit. The target structure 52 includes N+ region 54 which is a part of the integrated circuit substrate. An essentially square polysilicon layer 56 is fabricated over an oxide layer 58 which is on the surface of the integrated circuit substrate 10. Note in FIG. 4 that the N+ region 54 surrounds the polysilicon layer 56 but extends only slightly beneath the polysilicon layer. This is due to the processing step in which the N+ material is implanted into the substrate.

The dimensions for a typical application of the target structure 52 are shown in FIG. 3. The N+ region is approximately 4 mils long on each side and the polysilicon layer 56 is approximately 2 mils long on each side. These are the suggested dimensions for one application. However, as the technology of integrated circuit manufacturing advances these dimensions are subject to change.

In the use of the target structure 52 the laser beam 32 is scanned across the structure 52 along a scan line such as, for example, line 64. As the laser beam transitions from impingement upon the N+ region to impingement upon the polysilicon layer 56 there will be a change in the voltage noted by the voltmeter 44 as described above. By tracking across the scan line 64 the edges of the polysilicon layer 56 can be detected. The middle point between the two detected edges determines the middle point of the target structure 52. The absolute locations of the edge points of the polysilicon layer 56 can be different from one die to another depending upon variables in the manufacturing process. However, the midpoint between the edges of the layer 56 should remain constant and be independent of manufacturing variables.

After the laser has tracked along the scan line 64 it is directed along a scan line 66 to detect the remaining edges of the polysilicon layer 56. Scan line 66 is approximately normal to scan line 64. From these edges the midpoint of the line is again calculated. The two calculated midpoints are then utilized to determine the two dimensional midpoint of the target structure 52.

Figure 6:
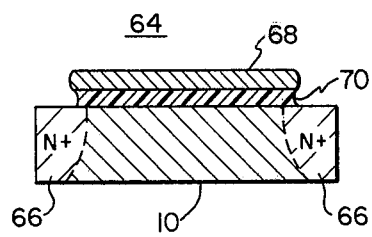
FIG. 6 is a sectional view taken along lines 6—6 of the target structure shown in FIG. 5.

An additional target structure 64 is illustrated in FIGS. 5 and 6. The target structure 64 includes an N+ region 66 which is a portion of the substrate 10 of the integrated circuit. An X-shaped polysilicon layer 68 is fabricated over an oxide layer 70 which is on the surface of the integrated circuit substrate. In a typical application the target structure 64 has a dimension of 4 mils on each side and a polysilicon layer 68 has a width of 20 microns for each arm. As noted for the target structure 52 these dimensions are subject to change.

In an application of the target structure 64 a scan sweep of the laser beam 32 is made across the target along a line 69. Line 69 is roughly diagonal to the X and Y axes of the polysilicon layer 68. The sweep along line 69 by the laser beam 32 detects the edge transitions of the polysilicon layer 68. The sweep along the line 69 detects transitions and makes a coarse determination of the midpoint of structure 64 since two horizontal transitions are crossed and two vertical transitions are crossed. An extremely accurate determination of the midpoint of structure 64 can be made by carrying out the sweeps shown by lines 71 and 72. These sweeps are made at right angles to the transition edges thereby providing a sharp indication of the location edges thereby providing a sharp indication of sweep lines 71 and 72 is calculated to determine the midpoint of the target structure 64.

Figure 7:
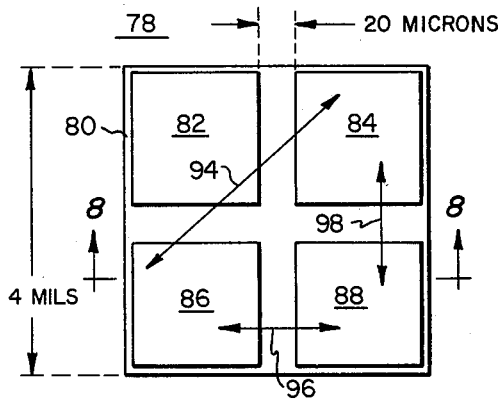
FIG. 7 is a plan view of a third target structure for an integrated circuit.
Figure 8:
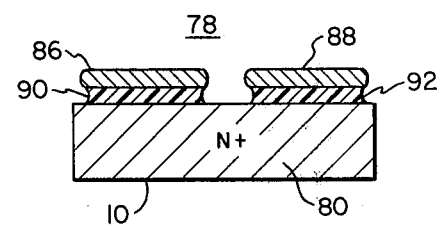
FIG. 8 is a sectional view taken along lines 8—8 of the target structure shown in FIG. 7.

A still further target structure 78 is illustrated in FIGS. 7 and 8. Structure 78 includes an N+ region 80 which is a portion of the substrate 10 for an integrated circuit. The target structure 78 further includes polysilicon layer area 82, 84, 86 and 88. In a preferred embodiment the target structure 78 is 4 mils long on each side and the spacing between the areas 82, 84, 86 and 88 is 20 microns. As noted above this spacing is subject to change with developing technology. Each of the polysilicon layer areas is fabricated over an oxide layer with the oxide layers 90 and 92 being shown in FIG. 8. Note that the target structure 78 is essentially the inverse of the target structure 64 shown in FIGS. 5 and 6.

In the use of the target structure 78 the laser beam 32 is directed along a scan track such as shown by line 94. The laser beam is directed diagonally across the target structure 78 to detect two horizontal and two vertical transitions across the polysilicon layers. These four transitions enable a calculation which gives a coarse determination of the midpoint of the target structure 78. The laser beam is then tracked along lines 96 and 98 to make a sharp determination of the vertical and horizontal edges of the polysilicon layers. As with the other target structures and midpoints of the transitions are calculated to determine the midpoint of the overall target structure 78.

Note in FIG. 7 that for the target structure 78 the N+ region 80 covers the entire substrate area of the target structure 78.

For each of the target structures described above the N+ regions correspond to the N+ region 34 shown in FIG. 2. The apparatus shown in FIG. 2 is used together with each of the target structures to determine the locations of the edge transitions as described in reference to FIG. 2.

Figure 9:
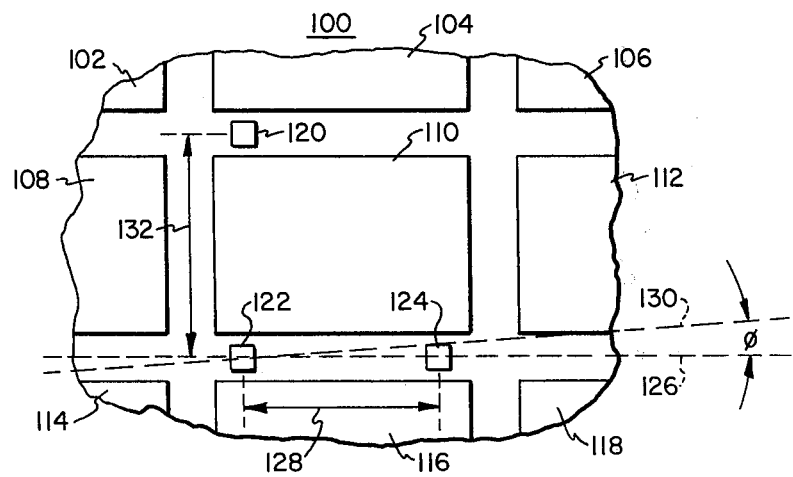
FIG. 9 is a plan view of a wafer having a plurality of dies and a group of target structures for aligning the wafer.

Referring now to FIG. 9 a wafer 100 is shown which includes a plurality of dies 102-118. Hundreds or even thousands of such dies can be fabricated on a single wafer. Note that there is a separation area between each of the dies.

Along with the dies on the wafer 100 a plurality of target structures such as 120, 122 and 124 are also fabricated on the wafer. Each of these target structures can be any one of the target structures 52, 64 or 78 described above.

In a typical application the midpoint of target structures 122 and 124 is determined. This determines the location of the target structures along a line 126 and the spacing distance shown by line 128. The reference axis is shown by the line 130. The angular offset $\phi$ is determined by the angular distance between lines 126 and 130. The spacing between targets 122 and 124 is compared to the design spacing to determine a scaling factor. The target 120 can also be located to calculate the distance shown by line 132 and determine a scaling factor and to further resolve the angular orientation. Thus with three targets there can be a scaling factor not only for angular rotation but for horizontal and vertical dimensions. However, in many applications the necessary alignment parameters can be determined by locating only two target structures.

After the scaling and orientation factors are determined the laser beam can be directed to any designated point on the integrated circuit die 110 with great accuracy. For example, the laser beam can be directed to open fusible lines which permit the substitution of redundant circuit elements into the integrated circuit to replace defective circuit elements.

In summary, the present invention comprises a method and apparatus for determining the alignment of an integrated circuit die relative to a laser beam which can be accurately scanned across the surface of the integrated circuit. The center position of a target structure is determined by making one or two scans across the target structure such that horizontal and vertical transitions are made across a polysilicon layer. The mid-points of the transitions are calculated to accurately determine the location of the target sturcture. By use of a plurality of a target structures a scaling factor and an angular orientation factor can be determined such that the laser beam can accurately be directed to any other location on the die.

Although several embodiments of the invention have been illustrated in the accompanying drawings and described in the foregoing detailed description, it will be understood that the invention is not limited to the embodiments disclosed, but is capable of numerous rearrangements, modifications and substitutions without departing from the scope of the invention.

I claim:

1. A method for determining the location of an integrated circuit on a semiconductor substrate, comprising the steps of:

scanning a laser beam in a first scan across a target structure fabricated on said substrate such that said laser beam makes a first transition from impinging on a region of said substrate of impinging on a layer of nontransparent material which essentially blocks transmission of said laser beam and makes a second transition from impinging on said nontransparent material to impinging on said region wherein said region has an opposite conductivity type from that of said substrate;

applying a voltage to reverse bias a PN junction formed between said region and said substrate;

monitoring the current flow through said PN junction wherein said laser beam generates a current through said PN junction when said laser beam strikes said region but generates a lesser amplitude of current through said PN junction when said laser beam strikes said nontransparent material;

correlating the position of said laser beam with changes in amplitude of said current to locate edges of said non transparent layer; and determining a mid-location of said nontransparent material as being midway between said edges.

2. The method recited in claim 1 including the steps of:

scanning said laser beam in a second scan across said target said second scan at an angle to said first scan and including a third transition from said region to said nontransparent material and a fourth transition from said nontransparent material to said region; and determining a second mid-location of said target as being midway between the edges of said nontransparent material determined by said second scan; and determining a center location point of said nontransparent material as a function of said mid-locations determined by said first and said second scans.

3. A method for determining the position of an integrated circuit on a semiconductor substrate, comprising the steps of:

scanning a laser beam in a first scan across a target structure fabricated on said substrate to make a first transition from said laser beam impinging on a region of said substrate to impinging on a nontransparent material which blocks said laser beam, said region having an opposite conducitivity type from that of said substrate, said first scan continuing across said substrate to make a second transition which comprises moving said laser beam from impinging on said nontransparent material to impinging on said region;

scanning a laser beam in a second scan across said target structure, said second scan at an angle to said first scan, said second scan having a third transition which comprises moving said laser beam from impinging on said region to impinging on said nontransparent material, said second scan having a fourth transition which comprises moving said laser beam from impinging on said nontransparent material to impinging on said region;

applying a voltage to reverse bias a PN junction formed between said substrate and said region;

monitoring the current flow through said PN junction wherein said laser beam generates a current through said PN junction when said laser beam strikes said region, the amplitude of said current flow changing when said laser beam makes one of said transitions;

correlating the position of said laser beam with the changes in the amplitude of said current to locate the position of the edges of said nontransparent material;

determining the midpoint on said first scan between the positions corresponding to said first and said second transitions to locate a first midpoint for a portion of said nontransparent material;

determining the midpoint on said second scan between the positions corresponding to said third and said fourth transitions to locate a second midpoint for a portion of said nontransparent material; and determining the location of said target structure by use of said first and said second midpoints.

4. A method for determining the alignment of an integrated circuit on a semiconductor substrate, comprising the steps of:

directing at least one laser beam scan across a first target structure which is fabricated on said semiconductor substrate in a predetermined relation to said integrated circuit;

directing said at least one laser beam scan across a second target structure which is fabricated on said semiconductor substrate in a predetermined relation to said integrated circuit;

generating a change in current flow through a PN junction in said substrate for each of said targets when said laser beam makes a transition from impinging on a predetermined region of said substrate, said region having an opposite conductivity from that of said substrate, to a layer of nontransparent material which blocks transmission of said laser beam;

determining the location of each of said targets by correlating the changes in amplitudes of currents through said PN junctions with the position of said laser beam;

determining the spacing between said first and said second target structures;

comparing said spacing with a design spacing parameter to generate a scaling factor for determining distances to specific points on said integrated circuits.

* * * * *